United States Patent [19]

El-Ayat et al.

[11] Patent Number: 5,223,792
[45] Date of Patent: Jun. 29, 1993

[54] TESTABILITY ARCHITECTURE AND TECHNIQUES FOR PROGRAMMABLE INTERCONNECT ARCHITECTURE

[75] Inventors: Khaled A. El-Ayat; Jia-Hwang Chang, both of Cupertino, Calif.

[73] Assignee: Actel Corporation, Sunnyvale, Calif.

[21] Appl. No.: 891,969

[22] Filed: May 26, 1992

Related U.S. Application Data

[60] Division of Ser. No. 822,490, Jan. 14, 1992, which is a continuation of Ser. No. 375,799, Jul. 5, 1989, Pat. No. 5,083,083, which is a continuation-in-part of Ser. No. 195,728, May 18, 1988, Pat. No. 4,873,459, which is a continuation-in-part of Ser. No. 909,261, Sep. 19, 1986, Pat. No. 4,758,745.

[51] Int. Cl.$^5$ .................. G01R 31/00; G01R 31/26
[52] U.S. Cl. .................. 324/158 R; 324/158 T; 371/28; 307/465; 307/468
[58] Field of Search .................. 324/158 R, 158 T; 371/22.2, 28; 307/465, 468, 202.1; 365/201

[56] References Cited

U.S. PATENT DOCUMENTS

| | | | |
|---|---|---|---|
| 3,636,518 | 1/1972 | van Bosse | 365/201 |
| 3,795,859 | 3/1974 | Benante et al. | 324/158 T |
| 3,995,215 | 11/1976 | Chu et al. | 324/158 T |
| 4,004,222 | 1/1977 | Gebhard | 324/158 R |
| 4,253,059 | 2/1981 | Bell et al. | 324/158 R |
| 4,259,366 | 3/1981 | Balasubramanian | 437/193 |
| 4,380,811 | 4/1983 | Gotze et al. | 371/22.2 |
| 4,409,676 | 10/1983 | Varshney | 324/158 T |
| 4,418,403 | 11/1983 | O'Toole et al. | 371/28 |
| 4,553,225 | 11/1985 | Ohe | 371/28 |
| 4,577,190 | 3/1986 | Law | 307/468 |
| 4,597,062 | 6/1986 | Asano et al. | 365/201 |
| 4,612,630 | 9/1986 | Rosier | 365/201 |
| 4,617,478 | 10/1986 | Hartmann et al. | 307/468 |
| 4,651,304 | 3/1987 | Takata | 365/201 |
| 4,658,380 | 4/1987 | Eby | 365/201 |
| 4,700,088 | 10/1987 | Tubbs | 307/468 |
| 4,719,418 | 1/1988 | Flaker | 324/158 R |
| 4,725,985 | 2/1988 | Ogura et al. | 365/201 |
| 4,751,679 | 6/1988 | Dehganpour | 365/201 |
| 4,864,165 | 9/1989 | Hoberman et al. | 307/467 |
| 5,065,090 | 11/1991 | Ghuwala | 324/158 R |
| 5,068,604 | 11/1991 | Van de Laglmaat | 324/158 R |

Primary Examiner—Ernest F. Karlsen
Assistant Examiner—William J. Burns
Attorney, Agent, or Firm—Kenneth D'Alessandro

[57] ABSTRACT

Apparatus for testing for defects in the form of ohmic leakage in an antifuse element disposed between first and second conductors in an integrated circuit prior to formation of electronic circuits by a user, includes circuitry, responsive to signals provided to the integrated circuit from an external source, for temporarily connecting together a first group of the conductors to form a circuit path to the first conductor during a first time period. Circuitry, responsive to signals provided to the integrated circuit from an external source, is provided to temporarily connect together a second group of the conductors to form a circuit path to the second conductor during the first time period. Circuitry is provided to place an electrical charge onto the first conductor during a second time period within the first time period such that a selected dynamic first voltage potential is placed on the first conductor. Circuitry is provided to drive the second conductor to a second voltage potential different from the selected dynamic first voltage potential during a third time period subsequent to the second time period and within the first time period, wherein the difference between the first voltage potential and the second voltage potential is less than the voltage necessary to cause degradation of the antifuse element. Circuitry is provided to sense the voltage on the first conductor at a predetermined time after the start of the third time period and within the first time period. Circuitry is provided to store a signal related to the voltage on the first conductor at the predetermined time after the start of the third time period. Circuitry is provided to communicate the signal to an input/output pad of the integrated circuit.

3 Claims, 7 Drawing Sheets

TESTABILITY ARCHITECTURE AND TECHNIQUES FOR PROGRAMMABLE INTERCONNECT ARCHITECTURE

RELATED APPLICATIONS

This application is a division of co-pending application Ser. No. 07/822,490, filed Jan. 14, 1992, which is a continuation of application Ser. No. 07/375,799, filed Jul. 5, 1989, now U.S. Pat. No. 5,083,083, which is a continuation-in-part of application Ser. No. 07/195,728, filed May 18, 1988, now U.S. Pat. No. 4,873,459, which is a continuation-in-part of application Ser. No. 07/909,261, filed Sep. 19, 1986, now U.S. Pat. No. 4,758,745.

BACKGROUND OF THE INVENTION

1. Field of the Invention

The present invention relates to the test techniques and testability architectures used in testing integrated circuits. More specifically, the invention pertains to test techniques applied to testing of user-configurable arrays before they are configured by the user.

2. The Prior Art

User-configurable gate arrays consist of logic circuits or blocks that can be connected together by configurable interconnections, such as anti-fuse elements, to implement a desired circuit function. The configurable interconnect consists of interconnect layers such as metallization, and configurable devices which, when programmed, establish electrical connections between the interconnect layers. However, before configuring the circuit to implement a particular function, all the individual modules in the array and all the input/output (I/O) modules and buffers are isolated from one another. This presents a challenging test problem.

Before the circuit is configured by the user, all of the active circuits in such integrated circuits such as logic modules, I/O modules, configuring circuits, etc., must be tested and guaranteed to be fully functional and meet all required specifications. In addition, all passive interconnect circuits such as metallization interconnect, anti-fuse elements, feed-thru pass transistors, must also be free of defects and guaranteed. This is necessary so that a customer configuring such a circuit can expect a fully functional, high quality integrated circuit after his application circuit is mapped into the device. It is thus imperative that test architectures and test techniques be developed to solve this problem, namely, how to guarantee full functionality and spec of a one-time programmable user-configurable array circuit before the circuit is configured by the user.

User configurable arrays or PLDs (programmable logic devices) which use erasable elements to implement their interconnect do not have to contend with this problem since the array can be configured to implement any circuit pattern, be fully tested and later erased to the "blank" state for reconfiguration.

OBJECTS OF THE INVENTION

It is therefore an object of this invention to describe and demonstrate a fully testable architecture for unprogrammed user configurable gate arrays of the type disclosed in U.S. Pat. No. 4,758,745, issued Jul. 19, 1988, and similar gate array architectures.

Further, it is an object of this invention to illustrate how every active circuit element in these unprogrammed arrays, such as logic and I/O modules, configuring circuits, and, in addition, every passive circuit element in such arrays used for interconnect such as layers of interconnect, feed-thru transistors, etc. may be fully tested.

It is also an object of this invention to describe how any high voltage marginalities that may affect the configuration of such unprogrammed arrays can be tested for and screened out.

Yet another object of this invention is to provide that all anti-fuse elements in the interconnect portion of such unprogrammed arrays may also be tested and screened for marginalities and defects.

Finally, it is an object of the present invention to allow such arrays, in their unprogrammed state, to be tested for speed and binned accordingly.

BRIEF DESCRIPTION OF THE INVENTION

The present invention provides methods for testing unprogrammed user-configurable gate arrays of the type disclosed in U.S. Pat. No. 4,758,745, issued Jul. 19, 1988, and similar gate array architectures.

The disclosed invention describes a technique and an architecture that allows complete testing of anti-fuse-based arrays prior to configuring the array with the desired application pattern. This is particularly challenging since all circuit connections are normally open, yet all active circuitry such logic modules, I/O circuits, decode and programming circuits must be tested and full functionality and performance guaranteed prior to application configuring. The techniques described allow complete testing of all logic modules, I/O modules and buffers, vertical and horizontal channel continuity and shorts, addressing and decoding circuits, programming circuits, and anti-fuse integrity.

All such testing may be performed before the array is configured and interconnected to form a user circuit pattern. This is a necessary requirement to guarantee that all user configurable gate arrays have very high quality levels, are free of defects, meet all specifications and generate very high configuration yield (percentage of circuits configured properly that meet all specifications after the user circuit pattern is programmed.)

DETAILED DESCRIPTION OF A PREFERRED EMBODIMENT

U.S. Pat. No. 4,758,745, issued Jul. 19, 1988, to the same assignee as the present invention, is hereby expressly incorporated herein by reference.

Figure 1:
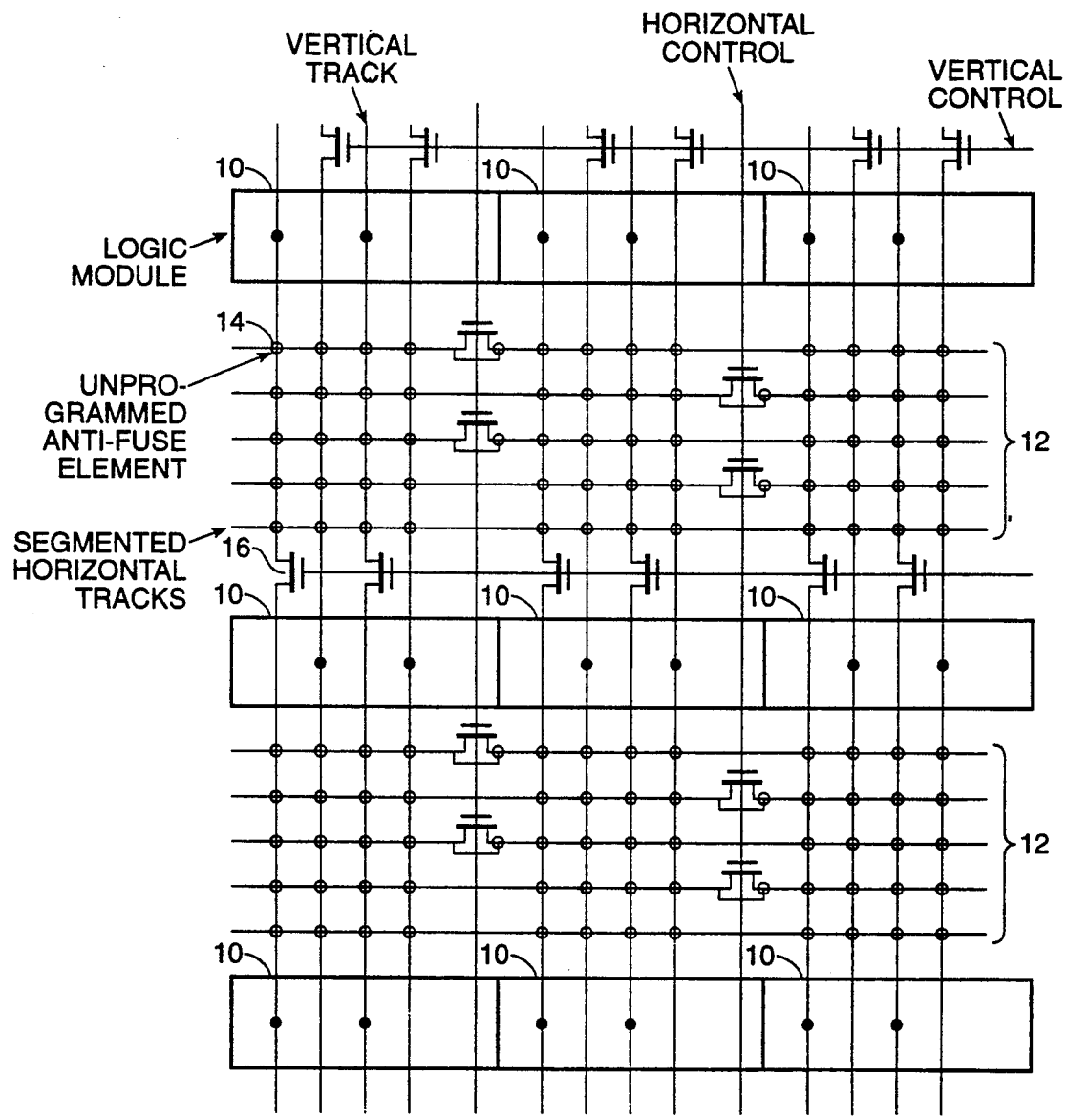
FIG. 1 is a block diagram of an example of the interconnect architecture with which the present invention may be used.

Referring first to FIG. 1, the configurable gate array which is an illustrative environment of the present invention has a channeled gate array architecture consisting of configurable logic modules 10 organized in rows and columns and separated by groups of horizontal wiring channels 12 and vertical wiring channels (vertical wiring channels have been omitted from FIG. 1 for clarity). A group of segmented wiring channels is associated with each row and each column. Unlike gate arrays, however, the channels contain predefined segmented metal tracks of different segment lengths to accommodate the routing requirements.

Anti-fuse elements, shown in FIG. 1 as small circles one of which is illustrated by reference numeral 14, are located between adjacent track segments in each channel and at the intersections of the horizontal and vertical track segments. Selected ones of the anti-fuses are shunted by series-pass transistors, shown in FIG. 1, one of which illustrated by reference numeral 16.

Circuit connections and module configuration are established by programming the appropriate anti-fuse element which then forms a low impedance connection between the required two metal segments. The concept is similar to vias between the first and second levels of metallization in double metallization technology.

Each logic module 10 is configurable to implement a large set of combinatorial logic cells as well as latches and flip flops for sequential circuit applications. The configurable gate array of FIG. 1 also has configurable I/O buffers that can be configured as input buffers, output buffers, or bidirectional I/O buffers. The structures of such buffers are well known in the art.

Wiring channels in a presently preferred embodiment of this architecture consist of a set of wiring segments of various lengths as described in U.S. Pat. No. 4,758,745. Careful choice of the lengths of the horizontal and vertical wiring segments as well as the number of segments in each channel provides routing flexibility comparable to gate arrays. Anti-fuse elements are located at the intersections of the horizontal and vertical segments as well as between adjacent horizontal segments in a channel and adjacent vertical segments in a channel. To program an anti-fuse element, a programming voltage $V_{pp}$ (presently preferred to be about 18 volts), is applied across its terminals while all other elements are subjected to half that voltage to avoid stressing the anti-fuse dielectric.

The preceding architecture is only an illustrative environment for the present invention. Those of ordinary skill in the art will readily recognize that this invention may be usefully employed with other PLD and gate array architectures. In addition, such persons will recognize that this invention is useful for virtually any integrated circuit utilizing metallization tracks.

Testing a one-time programmable gate array presents some challenging problems. Fortunately, testing is facilitated by the normally open anti-fuse elements. All circuit connections are normally open and will be established as the user application circuit is programmed into the chip. Yet all active circuits such as modules, I/O buffers, latches, and decoders must be tested and their functionality and performance guaranteed. In addition all passive circuit elements such as wiring channels must be free of defects such as opens and shorts.

Testability techniques of the present invention permit complete testing of every logic and I/O module, all vertical and horizontal tracks for opens and shorts, addressing and decoding circuits, all programming and high voltage circuits, integrity of all anti-fuses in the array, and AC performance of the chip.

Those of ordinary skill in the art will recognize from the disclosure herein that the circuits disclosed may be configured from standard MOS and CMOS circuits and circuit elements. Details about these elements are well known to those of ordinary skill in the art and will thus be omitted to avoid over complicating the disclosure.

Figure 2:
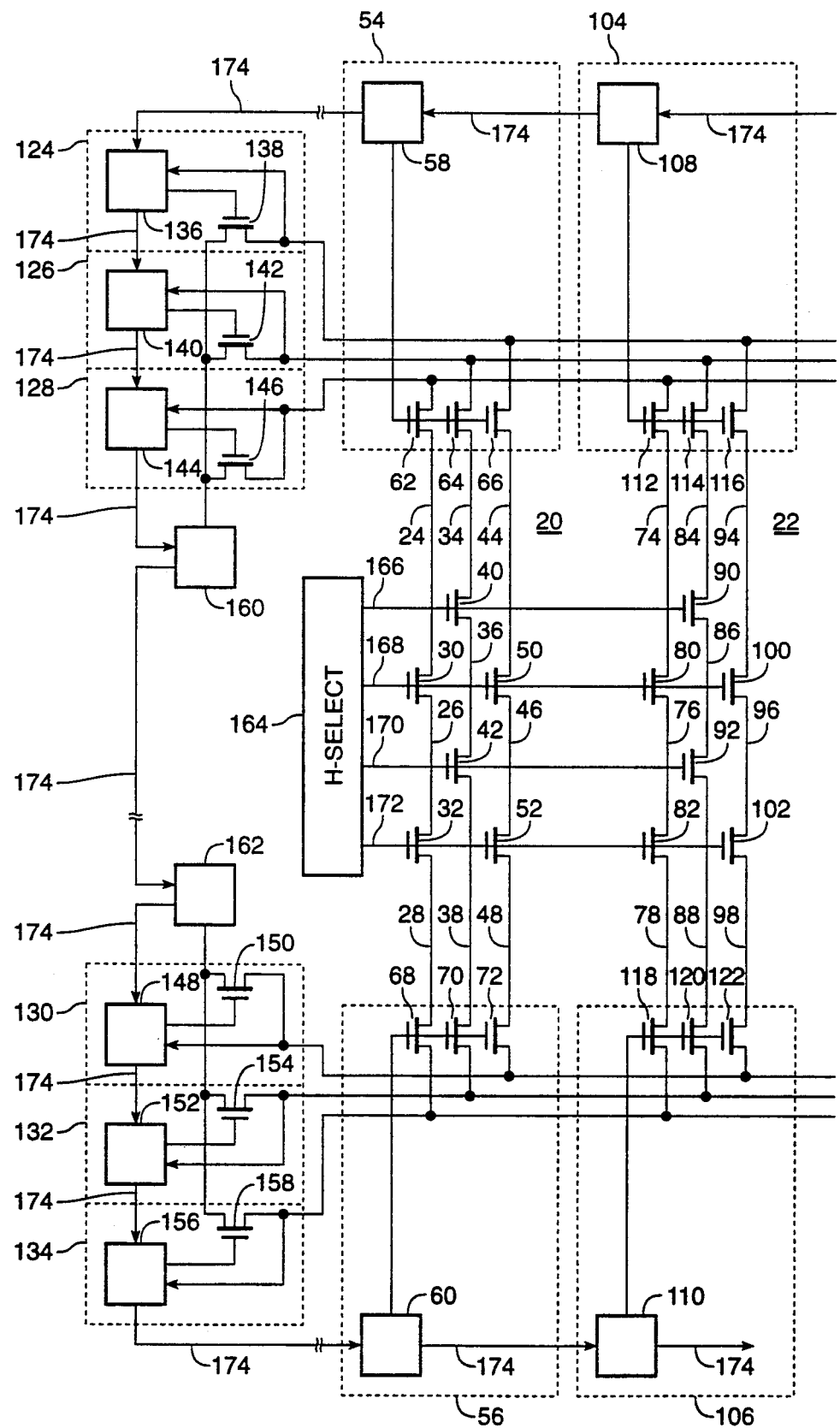
FIG. 2 is a block and schematic diagram of a presently-preferred architecture of the present invention used for applying the testing techniques of the present invention.

Referring now to FIG. 2, a typical circuit architecture and test path for use with the techniques of the present invention is shown. The test techniques of the present invention utilize a hardware element referred to herein as a decoder cell. FIG. 2 shows two columns 20 and 22, each containing three segmented channels. In column 20, the first channel includes segments 24, 26, and 28, separated by series-pass transistors 30 and 32, the second channel includes segments 34, 36, and 38, separated by series-pass transistors 40 and 42, and the third channel includes segments 44, 46, and 48, separated by series-pass transistors 50 and 52.

The upper and lower ends of the first, second, and third channels of column 20 (segments 24, 34, and 44, and 28, 38, and 48, respectively) are connected to upper column decoder 54 and lower column decoder 56, respectively. Upper column decoder 54 contains a decoder cell 58 and lower column decoder 56 contains a decoder cell 60. Decoder cell 58 drives three channel decode transistors 62, 64, and 66, connected to segments 24, 34, and 44, respectively. Decoder cell 60 drives three channel decode transistors 68, 70, and 72, connected to segments 28, 38, and 48, respectively. Those of ordinary skill in the art will recognize that the series-pass transistors and decoder transistors disclosed for this embodiment will be high voltage transistors, having voltage breakdown characteristics greater than the programming voltage $V_{pp}$ used in the circuit to be tested.

In column 22, the first channel includes segments 74, 76, and 78, separated by series-pass transistors 80 and 82, the second channel includes segments 84, 86, and 88, separated by series-pass transistors 90 and 92, and the third channel includes segments 94, 96, and 98, separated by series-pass transistors 100 and 102. The upper and lower ends of the first, second, and third channels (segments 74, 84, and 94, and 78, 88, and 98, respectively) are connected to upper column decoder 104 and lower column decoder 106, respectively.

The upper and lower ends of the first second and third channels of column 22 (segments 74, 84, and 94, and 78, 88, and 98, respectively) are connected to upper column decoder 104 and lower column decoder 106, respectively. Upper column decoder 104 contains a decoder cell 108 and lower column decoder 106 contains a decoder cell 110. Decoder cell 108 drives three channel decode transistors 112, 114, and 116, connected to segments 74, 84, and 94, respectively. Decoder cell 110 drives three channel decode transistors 118, 120, and 122, connected to segments 78, 88, and 98, respectively.

Figure 3:
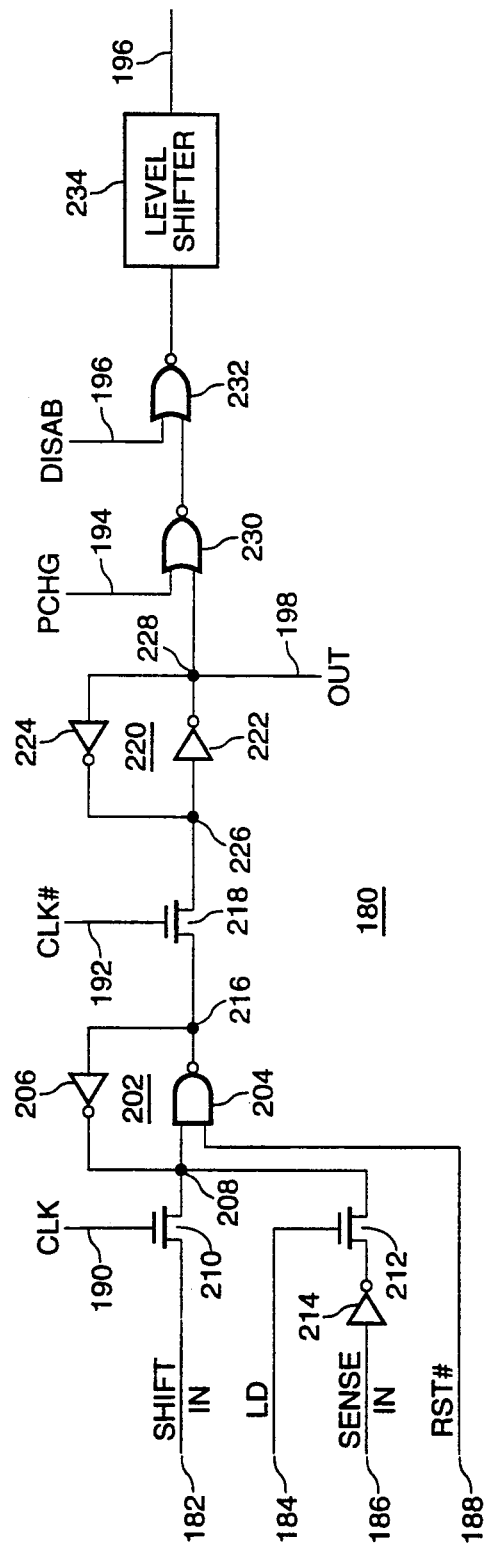
FIG. 3 is a schematic diagram of a presently preferred embodiment of a single decoder cell stage which may be used with the present invention.

The decoder cells disclosed herein, contain a single serial shift register stage and a gated driver, as will be more fully disclosed with reference to FIG. 3.

Also shown in FIG. 2 are group decoders 124, 126, 128, 130, 132, and 134. Upper group decoder 124 contains decoder cell 136 which drives group decode transistor 138. Upper group decoder 126 contains decoder cell 140 which drives group decode transistor 142. Upper group decoder 128 contains decoder cell 144 which drives group decode transistor 146. Lower group decoder 130 contains decoder cell 148 which drives group decode transistor 150. Lower group decoder 132 contains decoder cell 152 which drives group decode transistor 154. Lower group decoder 134 contains decoder cell 156 which drives group decode transistor 158.

As can be seen from FIG. 2, the upper and lower group decoders are associated with particular channels from each column. Upper and lower group decoders 124 and 130 are associated with the third channel in each of columns 20 and 22. Upper and lower group decoders 126 and 132 are associated with the second channel in each of columns 20 and 22. Upper and lower group decoders 128 and 134 are associated with the first channel in each of columns 20 and 22.

Two remaining decoder cells, 160 and 162, are shown in FIG. 2. Decoder cell 160 is for providing a voltage source for the drains of decoder transistors 138, 142, and 146. Decoder cell 162 is for providing a voltage source for the drains of decoder transistors 150, 154, and 158. The structure and operation of the decoder cells will be more fully described with reference to FIG. 3.

From an examination of FIG. 2, those of ordinary skill in the art will recognize that by selectively controlling the decoder cells and the decoder transistors, the wiring channels may be driven with voltages for the purpose of testing. The decoder cells are each loaded with a data bit. A "true" data bit (a logic one in the embodiment of FIG. 2) will cause the decoder transistor associated with the decoder cell to be turned on.

In addition, horizontal select decoder 164 may be used to selectively drive series-pass transistors 30, 32, 40, 42, 50, 52, 80, 82, 90, 92, 100 and 102. In a presently-preferred embodiment of the present invention, horizontal select (H-SEL) decoder 164 may be a series shift register having one stage per group of series-pass transistors connected to a H-SEL horizontal select control line. Horizontal select decoder 164 is operated by clocking into it a bit stream corresponding to the desired on or off states of the series-pass transistors which are to be controlled.

In the embodiment of FIG. 2, the gates of series-pass transistors 40 and 90 are driven by H-SEL line 166, the gates of series-pass transistors 30, 50, 80, and 100 are driven by H-SEL line 168, the gates of series-pass transistors 42 and 92 are driven by H-SEL line 170, and the gates of series-pass transistors 32, 52, 82 and 102 are driven by H-SEL line 172. This grouping of the gates of the series-pass transistors in FIG. 2 is in accordance with the preferred segmentation scheme disclosed in U.S. Pat. No. 4,758,745, but those of ordinary skill in the art will appreciate that other schemes may be used.

All of the decoder cells in FIG. 2 are shown connected by series shift register path 174. These individual decoder cells may be configured as a portion of the shift register chain disclosed in FIG. 1b of U.S. Pat. No. 4,758,745. Those of ordinary skill in the art will recognize that FIG. 2 is merely illustrative and that these single decoder cells need not be adjacent to one another and may be separated from one another by an arbitrary number of stages depending on the particular circuit onto which the testability architecture of the present invention has been grafted. The value of the bit from a series bit stream loaded into the entire serial shift register chain which resides in a particular decoder cell determines which of the decoder transistors 62, 64, 66, 68, 70, 72, 112, 114, 116, 118, 120, 122, 138, 142, 146, 150, 154, and 158 will be turned on during the driving phase and the sensing and latching phase of the tests performed according to the present invention.

While the disclosure of FIG. 2 has been limited to two vertical columns of channels, those of ordinary skill in the art will recognize that any number of vertical columns and channels per column may be employed, and further that although the disclosure has also been limited to vertical channels in columns for simplicity, those of ordinary skill in the art will recognize that the rows of channels in an array will be equipped with corresponding testability architecture of the type disclosed in FIG. 2 in order to be able to fully address and manipulate the channels and anti-fuses for testing.

Referring now to FIG. 3, a schematic of a presently preferred decoder cell for use in the present invention is disclosed. Those of ordinary skill in the art will recognize a portion of decoder cell 180 to be a single loadable serial shift register stage.

Decoder cell 180 includes a shift input 182, which is the serial shift input of the single loadable serial shift register stage of the decoder cell. Shift input 182 is connected by series shift register path 174 to the shift output of the previous serial shift register stage in the shift register chain as is well-known in the art.

A load input 184, commonly connected to all load inputs of all decoder cells on the chip, is used as a strobe to load test result data into a sense input of the serial shift register stage with which it is associated.

Sense input 186 is the load input of the serial shift register stage of the decoder cell and is the input into which the results of the test are loaded. Sense input 186 is connected to the circuit node from which data is desired to be taken.

A reset input 188, commonly connected to all reset inputs of all decoder cells on the chip, is used to reset the shift register stage in the decoder cell.

Clock input 190 and complementary clock input 192, common to all decoder cells, are used to clock the serial shift register stage in the decoder cell. As will be apparent to those of ordinary skill in the art, clock input 190 must be low when load input 184 is brought high (active) to avoid contention at node 208 between sense input 186 and shift input 182.

Precharge input 194, commonly connected to all precharge inputs of all decoder cells on the chip, is used to place a positive voltage charge on a channel associated with the shift register stage. Since all precharge inputs are connected together, all channels are precharged simultaneously.

Disable input 196, commonly connected to all disable inputs of all decoder cells on the chip, is used to disable the gated driver portion of the decoder cell by assuring that zero volts appears at the output of level shifter 234. Disable input 196 is held high during shifting in of data.

Shift output 198 is the output of the single serial shift register stage of the decoder cell and connects via serial shift register path 174 to the shift input of the next decoder cell.

A first latch section 202 of the single serial shift register stage contained within decoder cell 180 includes NAND gate 204 and inverter 206. NAND gate 204 has its output connected to the input of inverter 206. The output of inverter 206 is connected to a node 208 and to one input of NAND gate 204. Node 208 is driven by MOS transistors 210 and 212, which, in turn, are driven by shift input 182 and sense input 186 via inverter 214, respectively. The gate of MOS transistor 210 is driven by clock input 190 and the gate of MOS transistor 212 is driven by load input 184. The other input of NAND gate 204 is connected to reset input 188. The output of first latch section 202 is connected to a node 216, which drives a MOS transistor 218, having its gate connected to complementary clock input 192.

A second latch section 220 of the single serial shift register stage contained within decoder cell 180 includes a first inverter 222 and a second inverter 224. First inverter 222 has its input connected to an input node 226 and to the output of second inverter 224 and its output connected to an output node 228 and to the input of second inverter 224. Output node 228 of the second latch section is connected to shift output 198.

To reset the serial shift register stage, the reset input 188 is driven to a logic zero while clock input 190 is low and complementary clock input 192 is high. This allows resetting both latches 202 and 220 of the shift register using the minimum amount of circuitry.

The output node 228 of the second latch section 220 is also connected to one input of NOR gate 230. The other input of NOR gate 230 is driven by precharge input 194. The output of NOR gate 230 is connected to one input of NOR gate 232. The other input of NOR gate 232 is driven by disable input 196.

The output of NOR gate 232 is connected to the input of level shifter 234, the function of which is to drive the gates of the decoder transistors which can apply a voltage between zero volts and $V_{pp}$ to a selected segment or decoder cell, and as well known to those of ordinary skill in the art, a level shifter may be used to correctly bias the gate of an MOS transistor used as a decoder transistor in order to turn it one when it is supplied with a source of high voltage. Level shifter 234 may be one of many well-known level shifter circuits, or may be the level shifter circuit disclosed in co-pending application Ser. No. 287,217, filed Dec. 19, 1988, assigned to the same assignee as the present invention, expressly incorporated herein by reference.

Together, NOR gates 230 and 232, and level shifter 234, form the gated driver portion of decoder cell 180. If a logic one is present at either input of NOR gate 230, and the disable input 196 is a logic zero, the output of NOR gate 232 will be a logic one and will drive level shifter 234 to put out a voltage approximately equal to $V_{pp}$ for the purpose of driving the gates of the decoder transistors to fully turn them on at drain voltages of up to $V_{pp}$ as will be fully appreciated by those of ordinary skill in the art.

According to a presently preferred embodiment of the present invention, a unique test pattern is first serially loaded into the decoder cells by clocking data into the serial shift register chain of which they are a part. These bits, when in place in the decoder cells, are used to drive chosen channels to selected voltages by using the contents of the second latch sections 220 of the decoder cells 180. Those of ordinary skill in the art will recognize that the output of second latch section 220 of decoder cell 180 drives level shifter 234 unless overridden by a logic one signal at precharge input 194 or disable input 196. A precharge pulse presented simultaneously to all decoder cells in the array will precharge all channels to selected voltages. This circuitry and technique permits precharging and driving any channel with any desired test voltage to suit the test pattern. As will be appreciated by those of ordinary skill in the art, any number of channels may be simultaneously precharged and driven.

In the sensing/latching phase, the signals from the tested structure are latched into decoder cells by the use of the load and sense inputs 184 and 186 of decoder cells 180.

Finally, the shift-out/compare phase consists of simply shifting the test result out on one of the I/O pins and comparing it with the expected text results.

Figure 4:
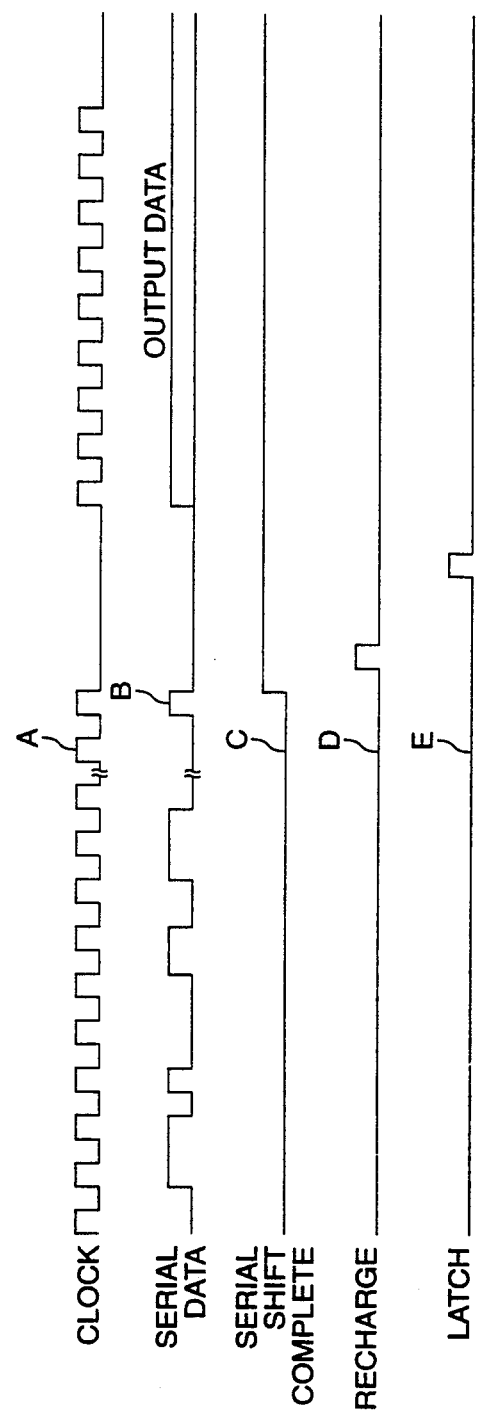
FIG. 4 is a timing diagram illustrating the application of the testing techniques of the present invention.

The driving phase and the sensing/latching phase may best be seen with reference to FIG. 4, a timing diagram showing the relationship between the various events involved in the testing sequence of the present invention.

Referring now to FIG. 4, the timing relationship between the various signals used during testing is shown. Clock pulses (trace a), applied to the clock inputs 190 of all decoder cells are used to clock a serial data bit stream (trace b) into the serial shift register path 172. Complementary clock pulses (not shown) are applied to complementary clock inputs 192 of all decoder cells. The end of the serial data bit stream is indicated by a shift stream end signal (trace c). At the shift stream end signal, further clock pulses are inhibited from reaching the shift register chain.

Depending on the test to be preformed, a precharge pulse as shown in trace d of FIG. 4 may then be applied to the precharge inputs 194 of the decoder cells 180 to place a predetermined voltage on all channel segments in the array. At the end of the precharge pulse, the contents of second latch sections 220 of selected decoder cells drive selected segments to other voltages (not shown).

After a predetermined amount of time, a load pulse (trace e) is provided to load input 184 of the decoder cells 180 to load the state of the segment to be sensed into the decoder cell.

After the desired data is loaded into the desired decoder cell, the entire shift register chain may be clocked out and the received data compared with expected data to determine functionality. This event is shown by the resumption of clock pulses in trace (a) of FIG. 4 following the occurrence of the load pulse.

Segment testing will be used as an example to illustrate the application of the testability technique of the present invention. The two common problems to be tested for in metallization segments are segment discontinuities (open circuits) and shorts to other segments or circuit paths.

Segment testing techniques of the present invention are illustrated with respect to FIG. 2. Although FIG. 2 illustrates techniques for vertical segment testing, those of ordinary skill in the art will realize that the same techniques may be used for horizontal segment testing. Continuously tests for "opens" in vertical segments is described again with reference to FIG. 2.

The first segment test to be described is a continuity test and may be illustrated by the example which tests for continuity of segments 24, 26, and 28 of the first channel in column 20. First, the appropriate serial data is shifted into all decoder cells as previously described.

Series-pass transistors 30 and 32 are turned on by shifting the appropriate bit pattern into horizontal decoder 164.

Next, using the precharge inputs of the decoder cells, all segments are precharged to an intermediate voltage from about preferably 5 to 7 volts from channel controllers associated with decoder cells 160 and 162 via the decoder transistors. If there is continuity, and series-pass transistors 30 and 32 are functioning, the charge exists on segments 24, 26, and 28.

Next, after the precharge pulse has ended, during the drive phase of this test, decoder transistor 62, in upper column decoder 54 and decoder transistor 68, in lower column decoder 56, are turned on, and decoder transistor 158 is turned off, as a result of the contents of the bits in the second latches of the respective decoder cells. The channel controller associated with decoder cell 160 drives segment 24 to zero volts.

If there are no discontinuities in the segments 24, 26, and 28, all of these segments in the channel will act as a continuous conductor and will thus provide a continuous electrical discharge path from the channel segments to the channel controller associated with decoder cell 160.

During the sense phase of the test, the voltage appearing on segment 28 is sensed by the sense input 186 of decoder cell 134 and the result is latched into its first latch section when a load pulse arrives at its load input 184. The latched result may then be serially shifted out of the chip using a designated output buffer and the test result compared with the expected value. The expected result is zero volts if there are no discontinuities since the segments, if connected together, will be all discharged to zero volts. If there are discontinuities in the segment path, caused by either open segments or failed series-pass transistors, they will prevent segment 28 from discharging to zero volts.

Those of ordinary skill in the art will recognize, that because all precharge and load inputs of all decoder cells are connected together, the above-described test may be performed simultaneously on all segments in the array and the shifted-out results from all will be available at the same time.

The second type of segment testing is "shorts" testing, where a channel of segments is tested for circuit shorts to neighbor segments in other channels or other non-related circuit elements. The shorts test checks for shorts or high impedance leakage between any of the segments in the three adjacent channels or other non-related circuit elements.

To perform this test, all segments in the first, second, and third adjacent wiring channels in column 20 are first connected together by turning on their series-pass transistors and then are precharged to the intermediate positive voltage in the manner described in the discontinuity test. The segments 34, 36, and 38 of the second channel are then driven to zero volts as described in the discontinuity test, thus creating a voltage differential between adjacent channels and their associated circuit paths.

In the sensing and latching phase, the voltages appearing on all of the channels are sensed for voltages other than zero or the intermediate positive voltage in the same manner in which sensing was performed in the discontinuity test. A voltage lower than the precharge voltage on either the first and third channels indicates a short between that channel and the second channel.

It is important to not that precharged channels are floating with a positive voltage charge while the channels at zero volts are driven to zero volts. The reason for these voltage conditions is to ensure the detection of a wide range of short circuit conditions, especially weak or high impedance shorts where only a very small current would flow between the two shorted paths.

In order to sense weak or high impedance shorts, a longer time period is allowed to elapse between the discharging of the voltage on the center channel and the sense and latching phase. Longer sensing times allow weak shorts more time to leak away their charge from the channel so that they may be detected by the sense circuitry. Those of ordinary skill in the art will recognize that this time interval will depend on the individual circuit to be tested, but in all cases will be a time sufficient for a high impedance short circuit fault to cause enough charge leakage to produce a voltage which will cross the latch digital threshold voltage.

Figure 5A:
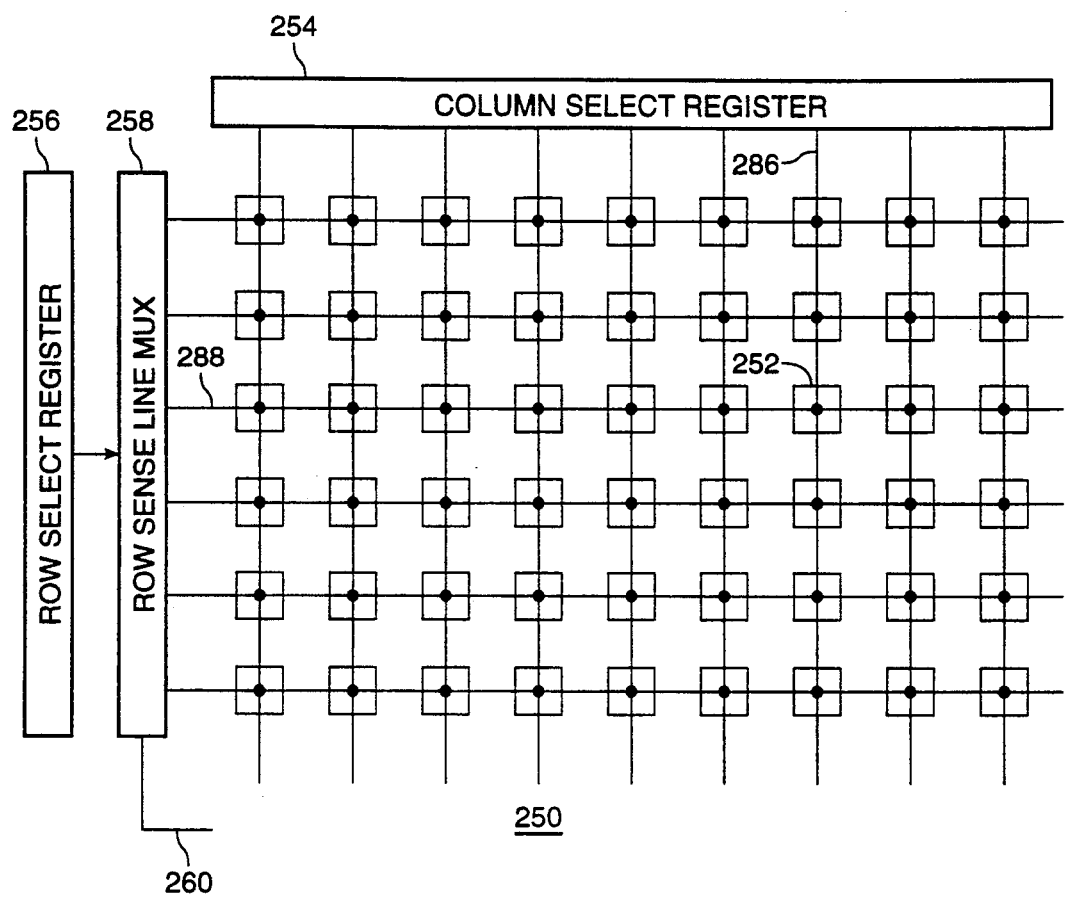
FIG. 5a is a block diagram of a presently preferred embodiment of circuitry used for logic module testing.

The techniques of the present invention may be used to test the functionality of logic modules in an architecture like that disclosed in U.S. Pat. No. 4,758,745. Referring now to FIG. 5a, a block diagram showing several aspects of the testability architecture built into the array includes an array 250 of logic modules arranged in rows and columns and including a logic module 252. Column select register 254 and row select register 256 allow the selection of any logic module in the array by decoding its row and column location. Row select register 256 drives a row sense line multiplexer 258, allowing output signals from a logic module in a selected row to appear on a single output line 260. Output line 260 may be brought out to an I/O pin of the chip or may be connected to a decoder cell disclosed herein.

Figure 5B:
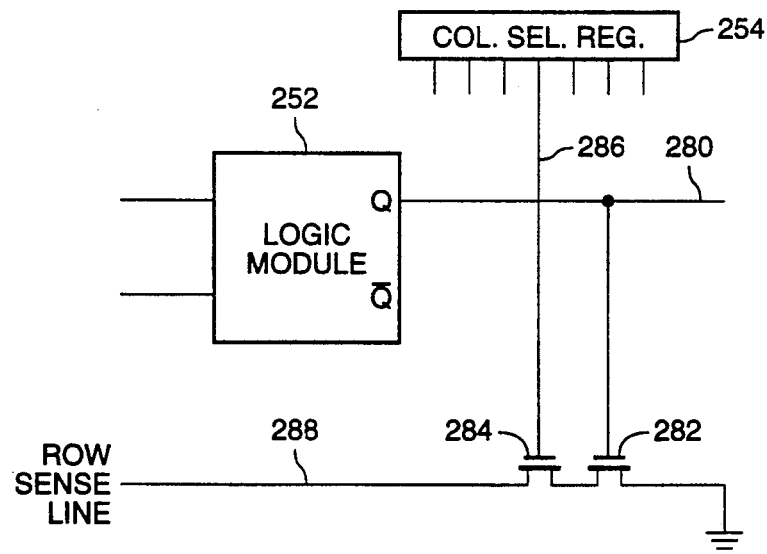
FIG. 5b is a schematic diagram of a portion of the circuitry of FIG. 5a used for logic module testing.

Referring now to FIG. 5b, a presently preferred embodiment of the circuit for monitoring the output of a selected logic module is disclosed. Logic module 252 has its Q output line 280 connected to the gate of a first transistor 282. The gate of a second transistor 284 is connected to a column driver output 286 of column select register 258. The drain of the second transistor 284 is connected to a row sense line 288 and its source is connected to the drain of first transistor 282. The source of first transistor 282 is connected to a fixed voltage, shown as ground in FIG. 5b. Row sense line 288 is common to the drains of all second transistors 284 associated with modules in that row.

When column driver output line 286 is high, the state of the Q output of logic module 252 will control the state of row sense line 288. If the Q output of logic module 252 is high, row sense line 288 will be pulled low.

Testing of logic modules according to a presently preferred embodiment of the present invention includes driving the inputs of the logic module to selected states and observing the output state of the module via the circuitry shown in FIGS. 5a and 5b. The logic module is selected by loading appropriate values into column select register 254 and row select register 256. The inputs to the logic module selected for testing are driven to known input voltages via the segments to which they are connected using the techniques described herein with reference to FIG. 2. These signals may be statically driven onto the lines or may be precharged as has been previously disclosed herein.

A signal representing the state of the Q output of logic module 252 will appear on row sense line 288. This signal will be routed through row sense line multiplexer 258 to a selected I/O pin on the chip or may be loaded into a decoder cell on the chip as previously disclosed. By varying the inputs to the logic module, and depending on the architecture of the logic module, those of ordinary skill in the art will realize that fully exhaustive testing of the logic module may be performed using the techniques of the present invention. To completely test the functionality of a logic module a set of input test patterns are defined to stimulate the module inputs and completely test its circuit functionality. The same technique can be used to test other types of functional blocks with multiple inputs and outputs. Since a large number of channel segments can be simultaneously driven by this test architecture, a large number of modules are simultaneously tested to save overall testing time.

Figure 6:
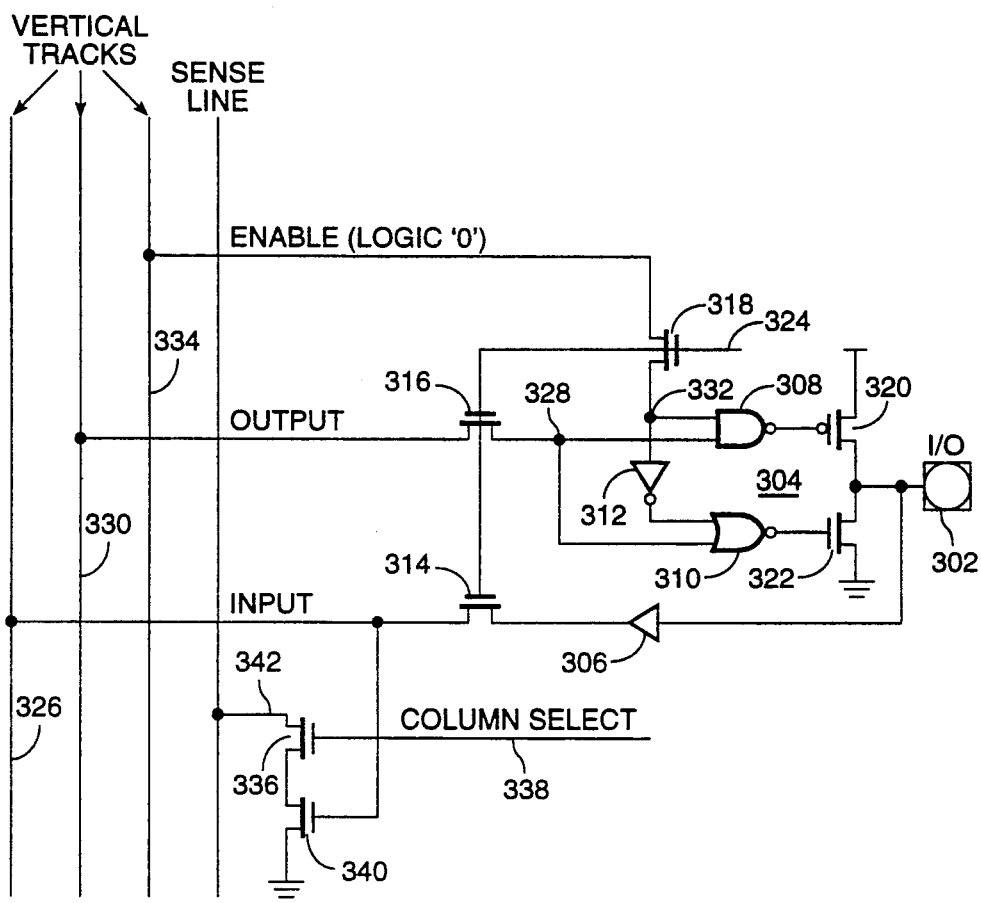
FIG. 6 is a schematic diagram of a presently preferred embodiment of circuitry which may be used for input and output buffer testing.

Referring now to FIG. 6, a schematic diagram of testing architecture which may be used with I/O modules of arrays is shown. I/O pad 302 is connected to bidirectional buffer 304. Bidirectional buffer 304 contains input buffer 306, output driver NAND gate 308, output driver NOR gate 310, inverter 312, isolation transistors 314, 316, and 318. and P-channel output drive transistor 320 and N-channel output drive transistor 322. An isolation control line 324 is connected to the gates of isolation transistors 314, 316, and 318. Isolation transistor 314 connects the input node output of input buffer 306 to an internal wiring segment 326. Isolation transistor 316 connects the input node 328 of the output buffer section of the I/O buffer to an internal wiring segment 330. Isolation transistor 318 connects the input node 332 of the enable input of the I/O buffer to an internal wiring segment 334. The enable input of the I/O buffer is used to place its output drive transistors 320 and 322 into a high impedance state. Those of ordinary skill in the art will appreciate that wiring segments 326, 330, and 334 are connected to test circuit architecture as disclosed with reference to FIG. 2.

Each I/O buffer may have associated with it a circuit like the one shown in FIG. 5b. In FIG. 6, a first MOS transistor 336 has its gate connected to a select output line 338 from a register such as the one disclosed with reference to FIGS. 5a and 5b. A second MOS transistor 340 has its gate connected to the source of isolation transistor 314. Second MOS transistor 340 has its source connected to a source of negative voltage, shown in FIG. 6 as ground and its drain connected to the source of first MOS transistor 336. The drain of first MOS transistor is connected to a sense line 342. In one embodiment of the present invention, transistors 336 and 340 are connected to the row/column select and drive registers and multiplexer disclosed with reference to FIG. 5a.

In order to test the input buffer 306, a logic one is placed on the isolation control line thus connecting the I/O buffer to its associated wiring segments 326, 330, and 334. A logic zero is driven onto wiring segment 334, thus disabling the output buffer section of the I/O buffer. Column select line 338 is brought to a logic high level. A desired logic signal is used to drive the I/O pad 302. If the input buffer 306 is functioning correctly, the logic signal detected on sense line 342 should be the complement of the logic signal placed on I/O pad 302. The signal on sense line 342 may be multiplexed to another I/O pad or be loaded into a decoder cell as previously disclosed.

To test an output buffer, wiring segment 330 is driven to a chosen logic level using the techniques previously described herein. Isolation input 324 is kept at a high logic level, and wiring segment 334, to which the output enable control is connected, is driven to a logic high level, thus enabling the output buffer. The logic signal on I/O pad 302 is then compared with the driving logic signal on wiring segment 330.

The anti-fuse based interconnect architecture with which the present invention is employed uses dynamic voltage precharging and refreshing techniques as previously described to maintain interim voltages inside the array to avoid erroneous programming of anti-fuses. Only the selected anti-fuse to be programmed is subjected to the full programming voltage across its terminals. Due to the dynamic scheme used it is critical that no leakage occurs from the dynamically charged nodes beyond normal junction leakage currents otherwise programming failure may occur. The floating channel test is designed to test for excessive leakage paths.

To perform the floating channel test, channels are precharged to the required test voltage by the use of a precharge pulse as previously disclosed. The channels are left floating with the stored charge for a known period of time, preferably 5 milliseconds. After the waiting period, the voltages on the channels are sensed and latched and then shifted out for external comparison with expected results. If the leakage is too high on any channel, the charge on the channel will leak away and after the known time period it will be sensed as a logic zero instead of the expected logic one. As those of ordinary skill in the art will readily recognize, the waiting period before sampling may be varied to test for different leakage characteristics.

Figure 7:
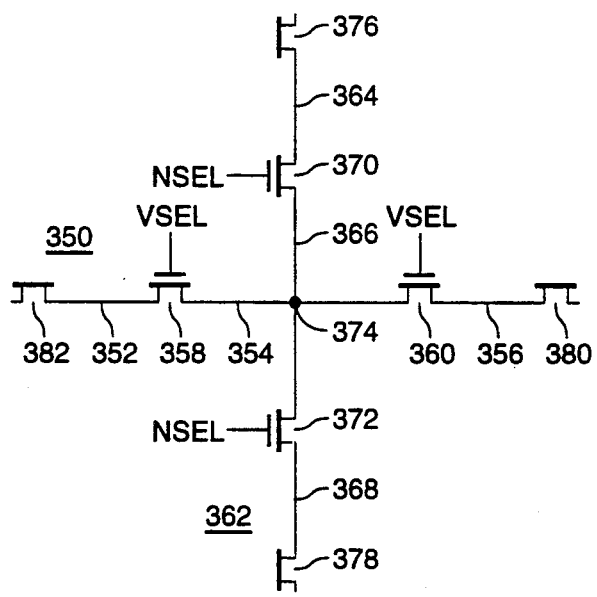
FIG. 7 is a schematic diagram of a presently preferred embodiment of circuitry used for testing for short circuits in unprogrammed anti-fuses and for stressing anti-fuses.

The techniques of the present invention may be used to perform three types of Anti-fuse tests. Circuitry for the performance of these tests is shown in FIG. 7. Anti-fuse shorts and anti-fuse stress may be tested. In addition, after programming a selected fuse, other fuses in the region of the programmed fuse may be tested to assure that they remain unprogrammed.

The anti-fuse shorts test is designed to check for any illegally-connected anti-fuses that may be introduced by the manufacturing cycle. The goal of the test is to ensure all anti-fuses in the array, of which there are a very large number, are in open circuit condition.

Referring now to FIG. 7, similar setup, precharge, drive, sense and latch, and shift out phases as other previously-described tests are used for anti-fuse testing, and will be described. In FIG. 7, horizontal channel 350 includes wiring segments 352, 354 and 356, separated by series-pass transistors 358 and 360. Vertical channel 362 includes wiring segments 364, 366 and 368, separated by series-pass transistors 370 and 372. Anti-fuse 374 is shown at the intersection of wiring segments 354 and 366. Series-pass transistors 358 and 360 are driven by V-SEL lines and series-pass transistors 370 and 372 are driven by H-SEL lines. The H-SEL and V-SEL lines are driven from horizontal select and vertical select decoders as disclosed in FIG. 2 at reference numeral 164. Decoder transistors 376, 378, 380, and 382, at the ends of horizontal and vertical channels 350 and 362 are associated with decoder cells (not shown) like the decoder cells of FIG. 2.

To perform the anti-fuse shorts test, first, the appropriate serial data is shifted into the decoder cells and into the H-SEL and V-SEL circuits to turn on the series-pass transistors 358, 360, 370, and 372 in the horizontal and vertical directions. Next, horizontal and vertical channels 350 and 362 are precharged to a precharge voltage using the techniques previously disclosed herein. The precharge voltage is selected so that no degradation of anti-fuse 374 occurs when the voltage is applied across its terminals. A presently-preferred value is about 5 to 7 volts. Vertical channel 362 is then driven to zero volts using the techniques previously disclosed herein.

In the sense and latch phase, horizontal channel 350 is sensed and latched into its associated decoder cell. The latched result is then shifted out for comparison with the expected results. If any charge has leaked from horizontal channel 350, anti-fuse 374 is shorted or leaky.

While the disclosure with reference to FIG. 7 is in terms of a single anti-fuse at an intersection of a horizontal and vertical channel, those of ordinary skill in the art will recognize that, utilizing the architecture and techniques of the present invention, all anti-fuses may be tested at once. Since in such an "all anti-fuse" simultaneous test, all horizontal channels are initially precharged with a voltage, a reading of zero volts on any horizontal channel indicates a defective fuse connecting a vertical channel to that horizontal channel.

The second type of anti-fuse test which may be illustrated with respect to FIG. 7 is the stress test. In this test, all anti-fuses in the array are deliberately subjected to a stress voltage across their terminals that is high enough to detect marginal anti-fuses. By applying an appropriately selected high voltage (approximately one half of $V_{pp}$, but low enough to avoid degradation of the anti-fuse characteristics) across the anti-fuse for a short period of time (a few seconds) an accelerated life test is performed on the anti-fuse, instead of the more common temperature screen life acceleration testing.

The test is performed by shifting appropriate data into the decoder cells and horizontal and vertical select decoders for turning on all series-pass transistors 358, 360, 370 and 372 and for driving vertical channel 362 to the stress voltage while driving horizontal channel 350 to zero.

The horizontal and vertical channels are then driven to those voltages, which are held for a few seconds. An anti-fuse shorts test as disclosed above is then performed to check for any failures. As with the shorts, test, those of ordinary skill in the art will realize that all intersection anti-fuses may be simultaneously tested.

In actual application of the arrays for which the present invention performs testing, high voltage circuitry is used to program the anti-fuse elements to form the interconnect networks needed to connect the logic modules or I/O modules together according to the user application requirements. Since the anti-fuse elements need high voltage to program them, all transistors in the programming path of the anti-fuse as well as controlling the programming path must be high voltage transistors capable of withstanding the highest possible voltages. The high voltage stress test ensures that all high voltage circuits have been tested and stressed at that high voltage and any failures screened out.

The test is performed by driving the entire array to the full high voltage using the driving group and column/row decoders used in all tests. The test patterns are chosen so that all controlling high voltage circuitry as well as programming circuitry are subjected to the full voltage, so that every high voltage transistor is stressed. While the high voltage circuits are being stressed the current being drawn by the circuit from the high voltage power supply is monitored. For a properly functioning circuit, only a very small leakage current (less than 20 microamperes) is expected. Any high voltage transistor failures would result in a high current (milliamperes) to be detected by the test equipment and would cause the rejection of the circuit. The test voltage chosen is higher than that seen in normal programming to provide for adequate margins and protect against equipment tolerances. After the test is completed with no failures detected, the anti-fuse shorts test and the floating track tests are repeated to ensure no failures were caused by the high voltage stress test.

The overhead of the testability circuits is minimized by sharing the periphery circuits and switching transistors inside the array between programming, testability and diagnostic modes. Appropriate test patterns are applied to the chip that thoroughly exercise it before configuration. All aspects of the chip are tested, including programming of redundant anti-fuses and integrity of unprogrammed anti-fuses (anti-fuse programming is verified by the programming hardware as the application is programmed). This assures high quality chips and good programming yield.

The testability architecture of the present invention may also be used during the process of anti-fuse programming to assure that only the anti-fuses selected for programming are actually programmed. After a selected anti-fuse has been programmed, all of the anti-fuses in the region of the programmed anti-fuse may be integrity tested to assure that they remain unprogrammed using a test similar to the anti-fuse shorts test disclosed above.

Figure 8:
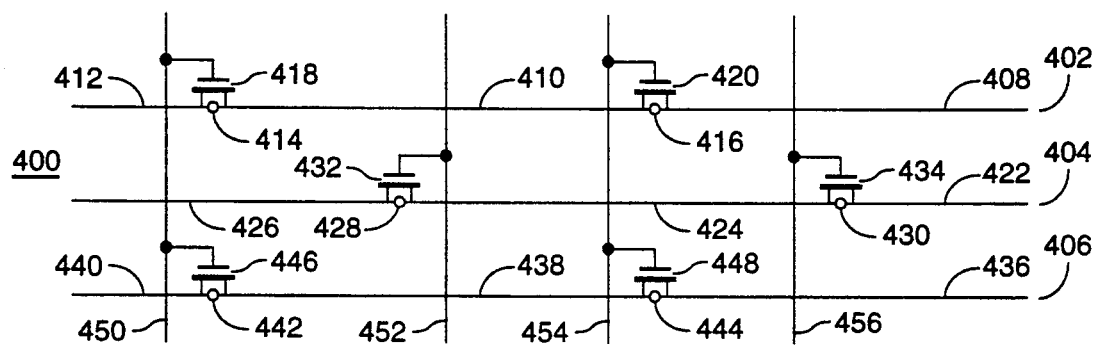
FIGS. 8 and 9 are schematic diagrams illustrating the performance of anti-fuse integrity tests.
Figure 9:
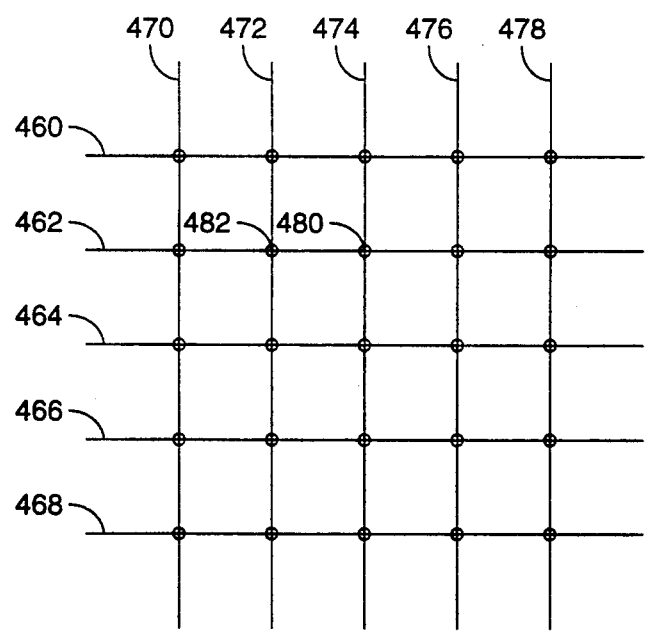

An example of the integrity testing during programming is disclosed with reference to FIGS. 8 and 9.

Referring first to FIG. 8, a column (or row) 400 is shown containing channels 402, 404, and 406. Channel 402 includes segments 408, 410, and 412, separated by anti-fuses 414 and 416. Anti-fuse 414 is shunted by series-pass transistor 418 and anti-fuse 416 is shunted by series-pass transistor 420. Channel 404 includes segments 422, 424, and 426, separated by anti-fuses 428 and 430. Anti-fuse 428 is shunted by series-pass transistor 432 and anti-fuse 430 is shunted by series-pass transistor 434. Channel 406 includes segments 436, 438, and 440, separated by anti-fuses 442 and 444. Anti-fuse 442 is shunted by series-pass transistor 446 and anti-fuse 444 is shunted by series-pass transistor 448.

The gates of series-pass transistors 418 and 446 are connected to H-SEL line 450. The gates of series-pass transistor 432 is connected to H-SEL line 452. The gates of series-pass transistors 420 and 448 are connected to H-SEL line 454. The gates of series-pass transistor 434 is connected to H-SEL line 450. This connection scheme is consistent with the architecture disclosed in U.S. Pat. No. 4,758,745.

If it is assumed that anti-fuse 416 is to be programmed, series pass transistor 418 must be turned on and series pass transistor 420 must be turned off. Accordingly, H-SEL line 454 must be placed at zero volts. H-SEL line 450 must be placed at $V_{pp}$ in order for series pass transistor 418 to be full turned on in order to place the programming voltage across anti-fuse 416. Segment 408 is driven to zero volts and 412 is driven to $V_{pp}$.

After anti-fuse 416 has been programmed, the integrity test may be performed by turning on the series-pass transistors associated with H-SEL lines 450, 452, and 456, leaving the series pass transistors driven by H-SEL line 454 turned off, precharging channels 402, 404, and 406 to from between 5–7 volts, and then driving segments 412 and 440 to zero. The expected results are zero volts remaining on segment 408 because of the discharge path including anti-fuse 416 and series-pass transistor 418, and the prechange voltage remaining on segments 404 and 406.

Referring now to FIG. 9, horizontal wiring segments 460, 462, 464, 466, and 468 intersect vertical wiring segments 470, 472, 474, 476, and 478. It is assumed that anti-fuse 480, at the intersection of segments 462 and 474 is programmed. An integrity test may be performed in two parts. The first part includes precharging all channels, driving vertical channel 474 (the vertical channel containing the expected-to-be-programmed anti-fuse) to zero volts, and sensing all horizontal channels. A zero should be sensed only in the horizontal segment containing the expected-to-be-programmed anti-fuse 462.

The second part of thge test includes precharging all channels, driving horizontal channel 462 (the horizontal channel containing the expected-to-be-programmed anti-fuse) to zero volts, and sensing all vertical channels. A zero should be sensed only in the vertical segment containing the expected-to-be-programmed anti-fuse.

Once a second anti-fuse 482 is programmed, the expected results of the test will change according to the location of the two programmed anti-fuses. In the example of FIG. 9, the expected test result includes two zeros (segments 472 and 474) when the vertical segments are sensed.

Sensing of a particular segment may be done froom two possible locations, top or bottom for vertical channels, and right and left for horizontal segments. The location of the sensing is determined by the programming sequence of the anti-fuse.

While a presently-preferred embodiment of the invention has been disclosed, those of ordinary skill in the art will, from an examination of the within disclosure and drawings be able to configure other embodiments of the invention. These other embodiments are intended to fall within the scope of the present invention which is to be limited only by the scope of the appended claims.

What is claimed is:

1. In a user-configurable integrated circuit including a plurality of conductors which may be connected to one another and to functional circuit blocks by programming user-programmable antifuse elements connected thereto to form electronic circuits, apparatus for performing accelerated life testing of an antifuse element disposed between first and second ones of said conductors prior to formation of said electronic circuits by a user, including:

means, responsive to signals provided to said integrated circuit from an external source, for temporarily connecting together a first group of said conductors to form a circuit path to said first conductor during a first time period;

means, responsive to signals provided to said integrated circuit from an external source, for temporarily connecting together a second group of said conductors to form a circuit path to said second conductor during said first time period;

means for placing an electrical charge onto said first conductor during a second time period within said first time period such that a selected dynamic first voltage potential is placed on said first conductor; and means for driving said second conductor to a second voltage potential different from said selected dynamic first voltage potential during a third time period subsequent to said second time period and within said first time period, wherein the difference between said first voltage potential and said second voltage potential is more than the voltage necessary to cause degradation of a marginal antifuse but lower than the voltage necessary to cause degradation of a good antifuse during said third time period.

2. The apparatus of claim 1, further including means for placing an electrical charge onto said first conductor during a fourth time period within said first time period such that a selected dynamic third voltage potential is placed on said first conductor;

means for driving said second conductor to a fourth voltage potential different from said selected dynamic first voltage potential during said fourth time period, wherein the difference between said third voltage potential and said fourth voltage potential is less than the voltage necessary to cause degradation of a good antifuse element;

means for sensing the voltage on said first conductor at a predetermined time after the start of said fourth time period and within said first time period;

means for storing a signal related to the voltage on said first conductor at said predetermined time after the start of said fourth time period; and means for communicating said signal to an input/output pad of said integrated circuit.

3. In a user-configurable integrated circuit including a plurality of conductors which may be connected to one another and to functional circuit blocks by programming user-programmable antifuse elements connected thereto to form electronic circuits, apparatus for testing for defects in the form of ohmic leakage in an antifuse element disposed between first and second ones of said conductors prior to formation of said electronic circuits by a user, including:

means, responsive to signals provided to said integrated circuit from an external source, for temporarily connecting together a first group of said conductors to form a circuit path to said first conductor during a first time period;

means, responsive to signals provided to said integrated circuit from an external source, for temporarily connecting together a second group of said conductors to form a circuit path to said second conductor during said first time period;

means for placing an electrical charge onto said first conductor during a second time period within said first time period such that a selected dynamic first voltage potential is placed on said first conductor;

means for driving said second conductor to a second voltage potential different from said selected dynamic first voltage potential during a third time period subsequent to said second time period and within said first time period, wherein the difference between said first voltage potential and said second voltage potential is less than the voltage necessary to cause degradation of said antifuse element;

means for sensing the voltage on said first conductor at a predetermined time after the start of said third time period and within said first time period;

means for storing a signal related to the voltage on said first conductor at said predetermined time after the start of said third time period; and means for communicating said signal to an input/output pad of said integrated circuit.

* * * * *

UNITED STATES PATENT AND TRADEMARK OFFICE
CERTIFICATE OF CORRECTION

PATENT NO.    : 5,223,792
DATED         : June 29, 1993
INVENTOR(S)   : Khaled A. El-Ayat, Jia-Hwang Chang It is certified that error appears in the above-indentified patent and that said Letters Patent is hereby corrected as shown below:

Column 2, line 27, after "such" insert --as--.
Column 3, line 27, after "which" insert --is--.
Column 8, line 16, replace "text" with --test--.
Column 10, line 1, replace "not" with --note--.
Column 10, line 41, replace "258" with --254--.
Column 12, line 34, replace "Anti-fuse" with --antifuse--.
Column 14, line 51, replace "450" with --456--.
Column 15, line 15, replace "462" with --480--.
Column 15, line 16, replace "thge" with --the--.
Column 15, line 28, replace "froom" with --from--.

Signed and Sealed this

Eighteenth Day of June, 1996

*Attest:*

BRUCE LEHMAN

*Attesting Officer*     *Commissioner of Patents and Trademarks*